United States Patent
Hu et al.

(10) Patent No.: US 10,032,460 B2
(45) Date of Patent: *Jul. 24, 2018

(54) FREQUENCY ENVELOPE VECTOR QUANTIZATION METHOD AND APPARATUS

(71) Applicant: HUAWEI TECHNOLOGIES CO., LTD., Shenzhen, Guangdong (CN)

(72) Inventors: Chen Hu, Shenzhen (CN); Lei Miao, Beijing (CN); Zexin Liu, Beijing (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/715,179

(22) Filed: Sep. 26, 2017

(65) Prior Publication Data

US 2018/0018980 A1   Jan. 18, 2018

Related U.S. Application Data

(63) Continuation of application No. 14/981,923, filed on Dec. 29, 2015, now Pat. No. 9,805,732, which is a
(Continued)

(30) Foreign Application Priority Data

Jul. 4, 2013   (CN) .......................... 2013 1 0279924

(51) Int. Cl.
*G10L 21/00*    (2013.01)
*G10L 19/038*   (2013.01)
(Continued)

(52) U.S. Cl.
CPC ............ *G10L 19/038* (2013.01); *G10L 19/06* (2013.01); *G10L 2019/0005* (2013.01)

(58) Field of Classification Search
CPC ................ G10L 19/038; G10L 19/06; G10L 2019/0005
(Continued)

(56) References Cited

U.S. PATENT DOCUMENTS

RE38,269 E    10/2003 Liu
6,952,671 B1  10/2005 Kolesnik et al.
(Continued)

FOREIGN PATENT DOCUMENTS

CN    1806445 A     7/2006
CN    101079661 A   11/2007
(Continued)

OTHER PUBLICATIONS

Stephen So et al. "Efficient product code vector quantisation using the switched split vector quantiser",Digital Signal Processing, XP005724179, Nov. 2005, total 34 pages.
(Continued)

*Primary Examiner* — Shaun Roberts
(74) *Attorney, Agent, or Firm* — Huawei Technologies Co., Ltd.

(57) ABSTRACT

Embodiments of the present application proposes a frequency envelope vector quantization method and apparatus, where the method includes: dividing N frequency envelopes in one frame into N1 vectors; quantizing a first vector in the N1 vectors by using a first codebook, to obtain a code word corresponding to the quantized first vector, where the first codebook is divided into $2^{B1}$ portions; determining, according to the code word corresponding to the quantized first vector; determining a second codebook according to the codebook of the $i^{th}$ portion; and quantizing a second vector in the N1 vectors based on the second codebook. In the embodiments of the present application, vector quantization can be performed on frequency envelope vectors by using a codebook with a smaller quantity of bits. Therefore, com-
(Continued)

plexity of vector quantization can be reduced, and an effect of vector quantization can also be ensured.

16 Claims, 2 Drawing Sheets

Related U.S. Application Data continuation of application No. PCT/CN2014/081530, filed on Jul. 3, 2014.

(51) Int. Cl.
*G10L 19/06* (2013.01)
*G10L 19/00* (2013.01)

(58) Field of Classification Search
USPC .......................................... 704/206, 222, 500
See application file for complete search history.

(56) References Cited

U.S. PATENT DOCUMENTS

| | | | |
|---|---|---|---|
| 8,125,884 | B1 | 2/2012 | Li et al. |
| 2002/0059062 | A1 | 5/2002 | Patel et al. |
| 2004/0039567 | A1 | 2/2004 | Jasiuk |
| 2005/0261897 | A1 | 11/2005 | Jelinek |
| 2006/0245489 | A1 | 11/2006 | Tsushima |
| 2006/0271356 | A1 | 11/2006 | Vos et al. |
| 2007/0016417 | A1 | 1/2007 | Sung et al. |
| 2007/0149180 | A1 | 6/2007 | Lin et al. |
| 2008/0059166 | A1 | 3/2008 | Ehara |
| 2009/0030699 | A1 | 1/2009 | Iser et al. |
| 2009/0240491 | A1 | 9/2009 | Reznik et al. |
| 2009/0299738 | A1 | 12/2009 | Sato et al. |
| 2010/0063806 | A1 | 3/2010 | Gao |
| 2010/0070269 | A1 | 3/2010 | Gao |
| 2010/0217753 | A1 | 8/2010 | Shlomot et al. |
| 2010/0274556 | A1 | 10/2010 | Sato et al. |
| 2011/0040558 | A1 | 2/2011 | Ehara |
| 2012/0029924 | A1 | 2/2012 | Duni et al. |
| 2013/0018660 | A1 | 1/2013 | Qi et al. |

FOREIGN PATENT DOCUMENTS

| | | |
|---|---|---|
| CN | 101261835 A | 9/2008 |
| CN | 101335002 A | 12/2008 |
| CN | 101483043 A | 7/2009 |
| CN | 102103860 A | 6/2011 |
| EP | 0770985 A2 | 5/1997 |
| JP | 2010244078 A | 10/2010 |
| RU | 2326450 C2 | 6/2008 |
| RU | 2387025 C2 | 4/2010 |
| RU | 2437172 C1 | 12/2011 |
| WO | 9510760 A2 | 4/1995 |
| WO | 2006107833 A1 | 10/2006 |
| WO | 2007114290 A1 | 10/2007 |

OTHER PUBLICATIONS

Salami R. et al., ITU-T G.729 Annex A: reduced complexity 8 kb/s CS-ACELP codec for digital simultaneous voice and data. IEEE Communications Magazine, Sep. 30, 1007, pp. 56-63.

Universal Mobile Telecommunications System (UMTS) Mandatory Speech Codec speech processing functions AMR Wideband speech codec Transcoding functions. 3GPP TS 26.190 version 5.1.0 Release 5. Dec. 2001. total 55 pages.

Yannis Agiomyrgiannakis et al. Conditional Vector Quantization for Speech Coding. IEEE Transactions on Audio, Speech, and Language Processing, vol. 15, No. 2, Feb. 2007. pp. 377-386. XP11157492A.

FREQUENCY ENVELOPE VECTOR QUANTIZATION METHOD AND APPARATUS

CROSS-REFERENCE TO RELATED APPLICATIONS

This application is a continuation of U.S. patent application Ser. No. 14/981,923, filed on Dec. 29, 2015, which is a continuation of International Application No. PCT/CN2014/081530, filed on Jul. 3, 2014. The International Application claims priority to Chinese Patent Application No. 201310279924.5, filed on Jul. 4, 2013. All of the aforementioned patent applications are hereby incorporated by reference in their entireties.

TECHNICAL FIELD

The present application relates to the field of encoding and decoding of information, and in particular, to a frequency envelope vector quantization method and apparatus.

BACKGROUND

Generally, a frequency envelope of a frame of input signal is obtained by taking square roots of average energy values at all or some of frequencies points.

Currently, a method for quantizing a frequency envelope by a codec usually involves a simple scalar quantization or a simple vector quantization. However, in some special cases, such a method may not be suitable. For example, when many frequency envelopes need to be obtained from one frame and a quantity of bits that can be used to quantize the frequency envelopes is somewhat limited, a scalar quantization of the frequency envelopes may not be suitable because it consumes a large quantity of bits.

An existing vector quantization method includes the following steps: (1) divide frequencies that need to be quantized into several vectors according to dimensions of the vectors; (2) pre-train a codebook with a length of $2^B$ by using a large quantity of vector samples and according to a quantity B of bits for quantizing each of the vectors, that is, this codebook has $2^B$ vectors, and these vectors are trained in advance according to the large quantity of vector samples; (3) compare a vector A that needs to be quantized with each of the vectors in the codebook, and search out a vector B that is closest to the vector A; and (4) a location index of the vector B in the codebook is a quantized value of the vector A.

Therefore, if all frequency envelopes are combined as a vector for vector quantization, a large codebook is required, which increases complexity.

How to design a simple and effective frequency envelope vector quantization method and ensure quantization quality at the same time is an urgent problem to be resolved.

SUMMARY

The present application proposes a frequency envelope vector quantization method and apparatus, aiming to resolve problems of insufficient quantization precision and excessive high complexity caused by an insufficient quantity of bits in a codebook and a relatively large quantity of frequency envelopes.

According to a first aspect, a frequency envelope vector quantization method is proposed, where the method includes: dividing N frequency envelopes in one frame into N1 vectors, where each vector in the N1 vectors includes M frequency envelopes, N1, N, and M are positive integers, M is greater than or equal to 2, and N is greater than N1; quantizing a first vector in the N1 vectors by using a first codebook that has B bits, to obtain a code word corresponding to the quantized first vector, where the first codebook is divided into $2^{B1}$ portions, B is a positive integer greater than or equal to 2, and B1 is a positive integer greater than or equal to 1; determining, according to the code word corresponding to the quantized first vector, whether the quantized first vector is associated with the $i^{th}$ portion in the $2^{B1}$ portions of the first codebook, where i is a positive integer greater than or equal to 1 and less than or equal to $2^{B1}$; based on a determination that the quantized first vector is associated with the $i^{th}$ portion in the $2^{B1}$ portions of the first codebook, determining a second codebook according to the codebook of the $i^{th}$ portion; and quantizing a second vector in the N1 vectors based on the second codebook.

With reference to the first aspect, in a first implementation manner of the first aspect, determining the second codebook according to the codebook of the $i^{th}$ portion includes: taking the $i^{th}$ portion of the first codebook as the second codebook, where a quantity of bits in the $i^{th}$ portion of the first codebook is B−B1.

With reference to the first aspect, in a second implementation manner of the first aspect, determining the second codebook according to the codebook of the $i^{th}$ portion includes: taking a pre-trained codebook as the second codebook, where a quantity of bits in the pre-trained codebook and a quantity of bits in the $i^{th}$ portion of the first codebook are the same, and are both B−B1.

With reference to the first aspect or the first or the second implementation manner of the first aspect, in a third implementation manner of the first aspect, when B1 is 1, the determining, according to the code word corresponding to the quantized first vector, whether the quantized first vector is associated with the $i^{th}$ portion in the $2^{B1}$ portions of the first codebook includes: when the code word corresponding to the quantized first vector belongs to a first half in two halves of the first codebook, determining that the quantized first vector is associated with the first half of the first codebook; or when the code word corresponding to the quantized first vector belongs to a second half in the two parts of the first codebook, determining that the quantized first vector is associated with the second half of the first codebook.

With reference to the first aspect or the first or the second implementation manner of the first aspect, in a fourth implementation manner of the first aspect, when M is 2 and B1 is 1, the determining, according to the code word corresponding to the quantized first vector, whether the quantized first vector is associated with the $i^{th}$ portion in the $2^{B1}$ portions of the first codebook includes: determining whether a ratio of a first value of the quantized first vector corresponding to the code word to a second value of the quantized first vector corresponding to the code word is within a preset range; and, when the ratio is within the preset range, the quantized first vector is associated with a first half in two halves of the first codebook; or when the ratio is not within the preset range, the quantized first vector is associated with a second half in the two halves of the first codebook.

With reference to the first aspect or any one of the first to the fourth implementation manners of the first aspect, in a fifth implementation manner of the first aspect, dividing N frequency envelopes in one frame into N1 vectors, includes: when the frame includes M subframes, and each subframe in the M subframes includes N1 envelopes, where the product of M and N1 is N, combining an envelope corresponding to each subframe in the M subframes into one vector, to obtain N1 vectors, where each vector in the N1 vectors includes M frequency envelopes.

According to a second aspect, a frequency envelope vector quantization apparatus is proposed, the apparatus comprises a processor and a memory storing program codes, wherein the program codes, when executed by the processor, cause the apparatus to perform a process that comprises: dividing N frequency envelopes in one frame into N1 vectors, where each vector in the N1 vectors includes M frequency envelopes, N1, N, and M are positive integers, M is greater than or equal to 2, and N is greater than N1; using a first codebook that has B bits to quantize a first vector in the N1 vectors, to obtain a code word corresponding to the quantized first vector, where the first codebook is divided into $2^{B1}$ portions, B is a positive integer greater than or equal to 2, and B1 is a positive integer greater than or equal to 1; determining, according to the code word corresponding to the quantized first vector whether the quantized first vector is associated with the $i^{th}$ portion in the $2^{B1}$ portions of the first codebook, where i is a positive integer greater than or equal to 1 and less than or equal to $2^{B1}$; based on a determination that the quantized first vector is associated with the $i^{th}$ portion in the $2^{B1}$ portions of the first codebook, determining a second codebook according to the codebook that is of the $i^{th}$ portion; quantizing a second vector in the N1 vectors based on the second codebook that is determined by the second determining unit.

With reference to the second aspect, in a first implementation manner of the second aspect, the determining the second codebook according to the codebook of the $i^{th}$ portion comprises: taking the $i^{th}$ portion of the first codebook as the second codebook, where a quantity of bits in the $i^{th}$ portion of the first codebook is B−B1.

With reference to the second aspect, in a second implementation manner of the second aspect, the determining the second codebook according to the codebook of the $i^{th}$ portion comprises: taking a pre-trained codebook as the second codebook, where a quantity of bits in the pre-trained codebook and a quantity of bits in the $i^{th}$ portion of the first codebook are the same, and are both B−B1.

With reference to the second aspect or the first or the second implementation manner of the second aspect, in a third implementation manner of the second aspect, when B1 is 1, the determining, according to the code word corresponding to the quantized first vector, whether the quantized first vector is associated with the $i^{th}$ portion in the $2^{B1}$ portions of the first codebook comprises: when the code word corresponding to the quantized first vector belongs to a first half in two halves of the first codebook, determining that the quantized first vector is associated with the first half of the first codebook; or when the code word corresponding to the quantized first vector belongs to a second half in the two halves of the first codebook, determining that the quantized second vector is associated with the second half of the first codebook.

With reference to the second aspect or the first or the second implementation manner of the second aspect, in a fourth implementation manner of the second aspect, when M is 2 and B1 is 1, the determining, according to the code word corresponding to the quantized first vector, whether the quantized first vector is associated with the $i^{th}$ portion in the $2^{B1}$ portions of the first codebook comprises: determining whether a ratio of a first value of the quantized first vector corresponding to the code word to a second value of the quantized first vector corresponding to the code word is within a preset range; and, when the ratio is within the preset range, the quantized first vector is associated with a first half in two halves of the first codebook; or when the ratio is not within the preset range, the quantized first vector is associated with a second half in the two halves of the first codebook.

With reference to the second aspect or any one of the first to the fourth implementation manners of the second aspect, in a fifth implementation manner of the second aspect, the dividing N frequency envelopes in one frame into N1 vectors: when the frame includes M subframes, and each subframe in the M subframes includes N1 envelopes, where the product of M and N1 is N, combining an envelope corresponding to each subframe in the M subframes into one vector, to obtain N1 vectors, where each vector in the N1 vectors includes M frequency envelopes.

In the embodiments of the present application, by dividing frequency envelopes into a plurality of vectors with fewer dimensions, vector quantization can be performed on frequency envelope vectors by using a codebook with a smaller quantity of bits. Therefore, complexity of vector quantization can be reduced, and an effect of vector quantization can be ensured.

BRIEF DESCRIPTION OF DRAWINGS

The following briefly introduces the accompanying drawings used in describing the embodiments of the present application.

DESCRIPTION OF EMBODIMENTS

Specific to a case in which a total quantity of bits is limited when vector quantization is performed on frequency envelopes, the embodiments of the present application proposes, according to features of frequency envelopes that need to be encoded and by using relationships such as relevance between frequency envelopes in a subframe, a frequency envelope vector quantization method, which is simple, bit-saving, and can ensure an effect of quantization. The vector quantization method according to the embodiment of the present application is specific to a case in which one frame includes a plurality of frequency envelopes.

Figure 1:
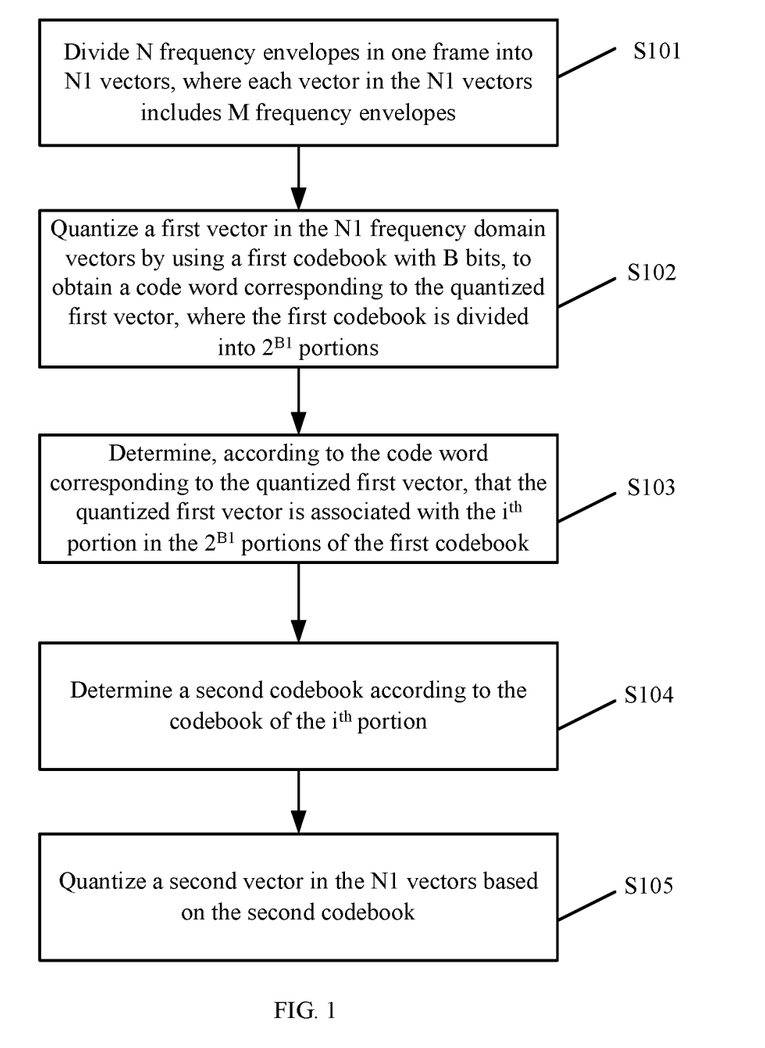
FIG. 1 is a flowchart of a frequency envelope vector quantization method according to an embodiment of the present application.

With reference to FIG. 1, the following describes a frequency envelope vector quantization method according to an embodiment of the present application. The vector quantization method includes the following steps:

S101. Divide N frequency envelopes in one frame into N1 vectors, where each vector in the N1 vectors includes M frequency envelopes, N1, N, and M are positive integers, M is greater than or equal to 2, and N is greater than N1.

For example, N frequency envelopes in one frame are divided into N1 M-dimensional vectors, and therefore, N1×M=N. Then, vector quantization is performed on the N1 vectors. In this way, because a quantity of dimensions decreases, to achieve proper quantization precision, a quantity of bits required for a single vector decreases accordingly, and complexity of vector quantization is also reduced.

When one frame includes M subframes, and each subframe in the M subframes include N1 envelopes, where the product of M and N1 is N, to reduce a quantity of dimensions, an envelope corresponding to each subframe in the M subframes may be further combined into one vector. Herein, the corresponding envelope may be an envelope at a corresponding frequency location. For example, the first envelopes of the M subframes are combined into a first vector, and the second envelopes of the M subframes are combined into a second vector, and the rest can be deduced by analogy. Finally, N1 vectors are obtained, where each of the vectors includes M frequency envelopes.

Generally, different vector combination manners may be used for different frequency envelope features. First, when a same subframe has more than two frequency envelopes, and there is a small quantity of subframes, for example, only two subframes, same frequency envelopes of the different subframes may be combined, so that a plurality of two-dimensional vectors can be obtained; second, when there are more than two subframes, the first frequency envelopes of the subframes may be combined into a first vector, and the $J^{th}$ frequency envelopes of the subframes may be combined into the $J^{th}$ vector.

S102. Quantize a first vector in the N1 vectors by using a first codebook, to obtain a code word corresponding to the quantized first vector, where B bits in the first codebook are divided into $2^{B1}$ portions, B is a positive integer greater than or equal to 2, and B1 is a positive integer greater than or equal to 1.

For example, a quantity of bits that are required for performing vector quantization on a first vector is B; then, a first codebook that has $2^B$ code words needs to be obtained by means of training. Because the N1 frequency envelope vectors belong to a same frame, a sequence of a codebook for the N1 vectors can be adjusted according to an order of these vectors, thereby estimating a range of a subsequent vector according to a quantization result of a previous vector, and reducing a quantity of bits that are required for performing vector quantization on the subsequent vector.

It is easy to understand that, if the first codebook is divided into two parts, and subsequently one part of the first codebook is used to quantize a subsequent vector, the part of the first codebook that is used to quantize the subsequent vector has only B−1 bits; or, if the first codebook is divided into four parts, and subsequently one part of the first codebook is used to quantize a subsequent vector, the part of the first codebook that is used to quantize the subsequent vector has only B−3 bits; and the rest can be deduced by analogy. That is, a codebook with a smaller quantity of bits can be used to perform vector quantization on frequency envelope vectors, thereby reducing complexity of vector quantization and ensuring an effect of vector quantization.

S103. Determine, according to the code word corresponding to the quantized first vector, that the quantized first vector is associated with the $i^{th}$ portion in the $2^{B1}$ portions of the first codebook, where i is a positive integer greater than or equal to 1 and less than or equal to $2^{B1}$.

For example, when B1 is 1, the first codebook is divided into two parts. Therefore, the quantized first vector is compared with each vector in the first codebook, to search out a vector that is in the first codebook and is closest to the first vector, where a location index of the vector in the first codebook is a quantized value of the first vector.

When it is determined that the quantized value of the first vector is in the former part of the first codebook, it is determined that the code word corresponding to the quantized first vector belongs to the former part in the two parts of the first codebook, that is, it is determined that the quantized first vector is associated with the former part of the first codebook, and the former part of the first codebook may be used as the second codebook; or, when it is determined that quantized value of the first vector is in the latter part of the first codebook, it is determined that the code word corresponding to the quantized first vector belongs to the latter part in the two parts of the first codebook, that is, it is determined that the quantized first vector is associated with the latter part of the first codebook, and the latter part of the first codebook may be used as the second codebook.

Alternatively, for example, when M is 2 and B1 is 1, the first codebook is divided into two parts, and each vector is two-dimensional. Therefore, the quantized first vector is compared with each vector in the first codebook, to search out a vector that is in the first codebook and is closest to the first vector, where a location index of the vector in the first codebook is a quantized value of the first vector.

Then, it is determined whether a ratio of the first value of the quantized first vector corresponding to the code word to the second value of the quantized first vector corresponding to the code word is within a preset range; and, when it is determined that the ratio is within the preset range, it is determined that the quantized first vector is associated with the former part in the two parts of the first codebook; or when it is determined that the ratio is not within the preset range, it is determined that the quantized first vector is associated with the latter part in the two parts of the first codebook. Herein, the preset range is a threshold range that is preset according to experience.

It is assumed that the first codebook that includes two-dimensional vectors is {(a1, b1), (a2, b2), (a3, b3), (a4, b4)}, where a code word of (a1, b1) (that is, a location index of (a1, b1) in the first codebook) is 1, a code word of (a2, b2) is 2, a code word of (a3, b3) is 3, and a codeword of (a4, b4) is 4. A code word is a location index that is in a codebook and is corresponding to each vector in the codebook. If it is determined that a code word corresponding to the quantized first vector is 3, the quantized first vector corresponding to the codeword is (a3, b3). Then, a ratio of the first value a3 to the second value b3 is compared with a preset range [a, b], and if the ratio is within the range, it is determined that the quantized first vector is associated with the former part in the two parts of the first codebook, and the former part of the first codebook may be used as the second codebook; or if the ratio is not within the range, it is determined that the quantized first vector is associated with the latter part in the two parts of the first codebook, and the latter part of the first codebook may be used as the second codebook.

S104. Determine a second codebook according to the codebook of the $i^{th}$ portion.

For example, as described above, the $i^{th}$ portion of the first codebook may be used as the second codebook, where a quantity of bits in the $i^{th}$ portion of the first codebook is B−B1. Alternatively, for example, a pre-trained codebook may be used as the second codebook, where a quantity of bits in the pre-trained codebook and the quantity of the bits in the $i^{th}$ portion of the first codebook are the same, and are both B−B1.

That is, a codebook for the second vector can be directly determined according to a part of a codebook for quantizing the first vector. In actual operations, one or more codebooks (with B−B1 bits) that include only some of code words in the first codebook may be trained according to requirements of different codecs, and used as a codebook for the second vector and a subsequent vector, thereby achieving an effect of reducing a quantity of bits that are required for quantization and optimizing quantization quality.

S105. Quantize a second vector in the N1 vectors based on the second codebook.

For example, the second vector and the subsequent vector may be quantized based on the second codebook that is determined according to a result of quantizing the first vector. That is, the first codebook that has B bits is used to quantize the first vector in the N1 vectors, to obtain the code word corresponding to the quantized first vector; then, it is determined that the code word corresponding to the quantized first vector belongs to the $i^{th}$ portion in the $2^{B1}$ portions of the first codebook; then, the second codebook is determined according to the codebook of the $i^{th}$ portion; finally, the second codebook is used to quantize another vector in the N1 vectors except the first vector.

Alternatively, for example, the second vector may also be quantized based on the second codebook that is determined according to the result of quantizing the first vector, and then a third vector is quantized based on a third codebook that is determined according to a result of quantizing the second vector, and the rest can be deduced by analogy.

It can be seen that, in the embodiments of the present application, by dividing frequency envelopes into a plurality of vectors with fewer dimensions, vector quantization can be performed on frequency envelope vectors by using a codebook with a smaller quantity of bits. Therefore, complexity of vector quantization can be reduced, and an effect of vector quantization can also be ensured.

In an implementation manner, when B1 is 1, the determining that the code word corresponding to the quantized first vector belongs to the $i^{th}$ portion in the $2^{B1}$ portions of the first codebook in step S103 and the determining a second codebook according to the codebook of the $i^{th}$ portion in step S104 specifically include:

determining whether the code word corresponding to the quantized first vector belongs to the first part, for example, the former part, in the two parts of the first codebook; and when it is determined that the code word corresponding to the quantized first vector belongs to the former part in the two parts of the first codebook, determining that the quantized first vector is associated with the former part in the two parts of the first codebook, and further determining that the second codebook is the former part of the first codebook; or when it is determined that the code word corresponding to the quantized first vector does not belong to the former part in the two parts of the first codebook, determining that the quantized first vector is associated with the latter part in the two parts of the first codebook, and further determining that the second codebook is the latter part of the first codebook.

In this case, the second codebook only needs B-1 bits.

In another implementation manner, when M is 2 and B1 is 1, the determining, according to the code word corresponding to the quantized first vector, that the quantized first vector is associated with the $i^{th}$ portion in the $2^{B1}$ portions of the first codebook in step 103 and the determining a second codebook according to the codebook of the $i^{th}$ portion in step S104 specifically include:

determining whether a ratio of the first value of the quantized first vector (a two-dimensional vector) corresponding to the code word to the second value of the quantized first vector corresponding to the code word is within a preset range; and when it is determined that the ratio is within the preset range, determining that the quantized first vector is associated with a former part in two parts of the first codebook, and further determining that the second codebook is the former part of the first codebook; or when it is determined that the ratio is not within the preset range, determining that the quantized first vector is associated with a latter part in the two parts of the first codebook, and further determining that the second codebook is the latter part of the first codebook.

In this case, the second codebook only needs B-1 bits.

In the foregoing two implementation manners, a case in which the first codebook that has B bits is divided into two parts is exemplarily described, and these are implementation manners easy to implement. It should be understood that, in this embodiment of the present application, a quantity of parts into which the first codebook is divided is not limited to 2, and the first codebook may also be divided into four parts, eight parts, or even more parts whose quantity is an integer power of 2. Generally, a larger quantity of parts into which the first codebook is divided results in lower accuracy of the determined second codebook; therefore, quantization precision may be affected. Therefore, a value of B1 may be determined with reference to a quantity of bits that can be actually used, that is, a quantity of parts into which the first codebook is divided and that can ensure quantization quality.

The following provides some specific embodiments, to describe in detail the frequency envelope vector quantization method according to this embodiment of the present application.

A first specific embodiment is as follows: If one frame includes N frequency envelopes, the frame is divided into N1 subframes, and each of the subframes has a same quantity M of frequency envelopes, the frequency envelopes (altogether M frequency envelopes) of each of the subframes are packaged as one vector, and therefore there are N1 vectors.

First, a first codebook A that has $2^B$ code words that are pre-trained and sorted is used to quantize a first vector by using B bits, and a quantization result is ind(1).

Then, it is determined whether the quantization result ind(1) is in the former part of the first codebook A.

If the quantization result ind(1) is in the former part of the first codebook A, the former part of the codebook A is used as a new codebook (that is, a second codebook that includes B-1 bits), to quantize the second vector and a subsequent vector by using the B-1 bits; or if the quantization result ind(1) is not in the former part of the first codebook A, code words in the latter part of the codebook A are used as a new codebook (that is, a second codebook that includes B-1 bits), to quantize the second vector and a subsequent vector by using the B-1 bits.

It can be seen that, in the first specific embodiment, first, a general codebook (for example, a first codebook) is sorted; then, with reference to a quantization result of the first vector, a quantization result of a subsequent vector is estimated; and then, a range of the codebook is narrowed down for quantizing the subsequent vector.

A second specific embodiment is as follows: If a vector is two-dimensional, the method in this specific embodiment may also be used.

First, a first codebook A that has $2^B$ code words that are pre-trained and sorted is used to quantize a first vector by using B bits, and a quantization result is ind(1).

Then, it is determined whether a ratio between two values of the quantized first vector is within a preset range [a, b], where the ratio is obtained by dividing the first value of the quantized first vector by the second value of the quantized first vector.

If the ratio is within the preset range [a, b], code words in the former part of the codebook A are used as a new codebook (that is, a second codebook that includes B−1 bits), to quantize the second vector and a subsequent vector by using the B−1 bits; or if the ratio is not within the preset range [a, b], code words in the latter part of the codebook A are used as a new codebook (that is, a second codebook that includes B−1 bits), to quantize the second vector and a subsequent vector by using the B−1 bits.

It can be seen that, in this specific embodiment, with reference to characteristics of a two-dimensional vector, a quantization result of a subsequent vector is estimated, and then a range of the codebook is narrowed down for quantizing the subsequent vector.

Figure 2:
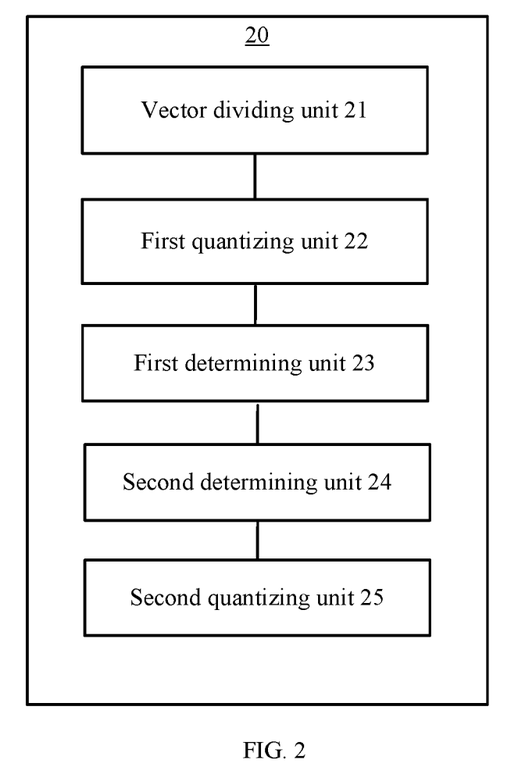
FIG. 2 is a functional diagram of a frequency envelope vector quantization apparatus according to an embodiment of the present application.

With reference to FIG. 2, the following describes a frequency envelope vector quantization apparatus according to an embodiment of the present application.

In FIG. 2, the frequency envelope vector quantization apparatus 20 includes a vector dividing unit 21, a first quantizing unit 22, a first determining unit 23, a second determining unit 24, and a second quantizing unit 25, where:

the vector dividing unit 21 is configured to divide N frequency envelopes in one frame into N1 vectors, where each vector in the N1 vectors includes M frequency envelopes, N1, N, and M are positive integers, M is greater than or equal to 2, and N is greater than N1;

the first quantizing unit 22 is configured to use a first codebook that has B bits to quantize a first vector in the N1 vectors that are obtained by means of the division by the vector dividing unit 21, to obtain a code word corresponding to the quantized first vector, where the first codebook is divided into $2^{B1}$ portions, B is a positive integer greater than or equal to 2, and B1 is a positive integer greater than or equal to 1;

the first determining unit 23 is configured to determine, according to the code word corresponding to the quantized first vector that is obtained by means of the quantization by the first quantizing unit 22, that the quantized first vector is associated with the $i^{th}$ portion in the $2^{B1}$ portions of the first codebook, where i is a positive integer greater than or equal to 1 and less than or equal to $2^{B1}$;

the second determining unit 24 is configured to determine a second codebook according to the codebook that is of the $i^{th}$ portion and is determined by the first determining unit 23; and the second quantizing unit 25 is configured to quantize a second vector in the N1 vectors based on the second codebook that is determined by the second determining unit 24.

Specifically, the second determining unit 24 may be configured to use the $i^{th}$ portion of the first codebook as the second codebook, where a quantity of bits in the $i^{th}$ portion of the first codebook is B−B1. Alternatively, the second determining unit 24 may be configured to use a pre-trained codebook as the second codebook, where a quantity of bits in the pre-trained codebook and a quantity of bits in the $i^{th}$ portion of the first codebook are the same, and are both B−B1.

Specifically, when B1 is 1, the first determining unit 23 may be configured to: when the code word corresponding to the quantized first vector belongs to a former part in two parts of the first codebook, determine that the quantized first vector is associated with the former part of the first codebook; or when the code word corresponding to the quantized first vector belongs to a latter part in the two parts of the first codebook, determine that the quantized first vector is associated with the latter part of the first codebook.

Alternatively, when M is 2 and B1 is 1, the first determining unit 23 may be configured to: determine whether a ratio of the first value of the quantized first vector corresponding to the code word to the second value of the quantized first vector corresponding to the code word is within a preset range; and, when it is determined that the ratio is within the preset range, determine that the quantized first vector is associated with a former part in two parts of the first codebook; or when it is determined that the ratio is not within the preset range, determine that the quantized first vector is associated with a latter part in the two parts of the first codebook.

Specifically, the vector dividing unit 21 may be further configured to: when the one frame includes M subframes, and each subframe in the M subframes includes N1 envelopes, where the product of M and N1 is N, combine an envelope corresponding to each subframe in the M subframes into one vector, to obtain N1 vectors, where each vector in the N1 vectors includes M frequency envelopes.

In the embodiments of the present application, by dividing frequency envelopes into a plurality of vectors with fewer dimensions, vector quantization can be performed on frequency envelope vectors by using a codebook with a smaller quantity of bits. Therefore, complexity of vector quantization can be reduced, and an effect of vector quantization can also be ensured.

Figure 3:
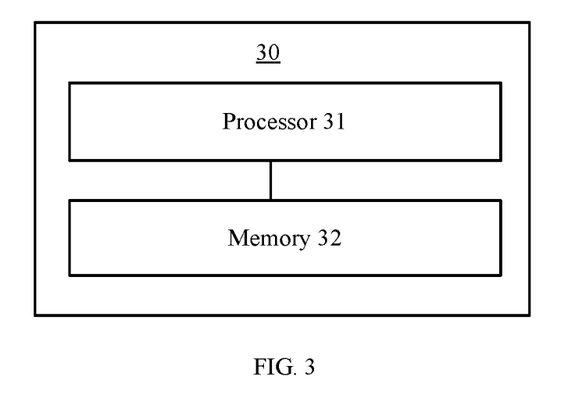
FIG. 3 shows a codec that implements a frequency envelope vector quantization method according to an embodiment of the present application.

FIG. 3 shows a codec that implements a frequency envelope vector quantization method according to an embodiment of the present application. The codec 30 includes a processor 31 and a memory 32. The processor 31 is configured to: divide N frequency envelopes in one frame into N1 vectors, where each vector in the N1 vectors includes M frequency envelopes, N1, N, and M are positive integers, M is greater than or equal to 2, and N is greater than N1; use a first codebook that has B bits to quantize a first vector in the N1 vectors, to obtain a code word corresponding to the quantized first vector, where the first codebook is divided into $2^{B1}$ portions, B is a positive integer greater than or equal to 2, and B1 is a positive integer greater than or equal to 1; determine, according to the code word corresponding to the quantized first vector, that the quantized first vector is associated with the $i^{th}$ portion in the $2^{B1}$ portions of the first codebook, where i is a positive integer greater than or equal to 1 and less than or equal to $2^{B1}$; determine a second codebook according to the codebook of the $i^{th}$ portion; and quantize a second vector in the N1 vectors based on the second codebook. The memory 32 is configured to store instructions that are used by the processor 31 to execute the foregoing method.

Specifically, when the one frame includes M subframes, and each subframe in the M subframes includes N1 envelopes, where the product of M and N1 is N, the processor 31 may combine an envelope corresponding to each subframe in the M subframes into one vector, to obtain N1 vectors, where each vector in the N1 vectors includes M frequency envelopes.

The processor 31 may use the $i^{th}$ portion of the first codebook as the second codebook, where a quantity of bits in the $i^{th}$ portion of the first codebook is B−B1; or use a pre-trained codebook as the second codebook, where a quantity of bits in the pre-trained codebook and a quantity of bits in the $i^{th}$ portion of the first codebook are the same, and are both B−B1.

When B1 is 1, the processor 31 may determine, according to that the code word corresponding to the quantized first vector belongs to a former part in two parts of the first codebook, that the quantized first vector is associated with the former part of the first codebook; or determine, according to that the code word corresponding to the quantized first vector belongs to a latter part in the two parts of the first codebook, that the quantized first vector is associated with the latter part of the first codebook. Alternatively, when M is 2 and B1 is 1, the processor 31 may determine, according to whether a ratio of the first value of the quantized first vector corresponding to the code word to the second value of the quantized first vector corresponding to the code word is within a preset range, that the quantized first vector is associated with the former part or the latter part of the first codebook; and, when it is determined that the ratio is within the preset range, determine that the quantized first vector is associated with a former part in two parts of the first codebook; or when it is determined that the ratio is not within the preset range, determine that the quantized first vector is associated with a latter part in the two parts of the first codebook.

It can be seen that, in the embodiments of the present application, by dividing frequency envelopes into a plurality of vectors with fewer dimensions, vector quantization can be performed on frequency envelope vectors by using a codebook with a smaller quantity of bits. Therefore, complexity of vector quantization can be reduced, and an effect of vector quantization can also be ensured.

Understandably, the solution described in each claim of the present application should also be deemed an embodiment, and the features in the claims may be combined. For example, different tributary steps of execution after a determining step in the present application may serve as different embodiments.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present application.

It may be clearly understood by a person skilled in the art that, for the purpose of convenient and brief description, for a detailed working process of the foregoing system, apparatus, and unit, refer to a corresponding process in the foregoing method embodiments, and details are not described herein again.

In the several embodiments provided in the present application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual needs to achieve the objectives of the solutions of the embodiments.

In addition, functional units in the embodiments of the present application may be integrated into one processing unit, or each of the units may exist alone physically, or two or more units are integrated into one unit.

When the functions are implemented in a form of a software functional unit and sold or used as an independent product, the functions may be stored in a computer-readable storage medium. Based on such an understanding, the technical solutions of the present application essentially, or the part contributing to the prior art, or some of the technical solutions may be implemented in a form of a software product. The software product is stored in a storage medium, and includes several instructions for instructing a computer device (which may be a personal computer, a server, or a network device) to perform all or some of the steps of the methods described in the embodiments of the present application. The foregoing storage medium includes: any medium that can store program code, such as a USB flash drive, a removable hard disk, a read-only memory (ROM), a random access memory (RAM), a magnetic disk, or an optical disc.

The foregoing descriptions are merely specific implementation manners of the present application, but are not intended to limit the protection scope of the present application. Any variation or replacement readily figured out by a person skilled in the art within the technical scope disclosed in the present application shall fall within the protection scope of the present application. Therefore, the protection scope of the present application shall be subject to the protection scope of the claims.

What is claimed is:

1. A method of quantizing frequency envelops of an audio signal for use by an audio signal encoder, comprising:
    obtaining N frequency envelopes of a frame of the audio signal, wherein N is an even integer;
    organizing the N frequency envelopes into N1 groups, wherein each group comprises two frequency envelopes, and N=2×N1;
    quantizing a first group of frequency envelopes to obtain a first vector by using a codebook, wherein the codebook has $2^B$ code words and each code word corresponds to a vector, and B is a positive integer greater than or equal to 2;
    determining if a code word corresponding to the first vector is in a first half of the codebook or in a second half of the codebook; and
    if the code word corresponding to the first vector is in the first half of the codebook, quantizing a second group of frequency envelopes by using the first half of the codebook, or
    if the code word corresponding to the first vector is in the second half of the codebook, quantizing a second group of frequency envelopes by using the second half of the codebook.

2. The method according to claim 1, wherein N is 8.
3. The method according to claim 2, wherein B is 4.
4. The method according to claim 1, wherein B is 4.
5. An audio signal encoding apparatus, comprising a processor and a memory storing program codes, wherein the program codes, when executed by the processor, cause the apparatus to perform a process that comprises:

obtaining N frequency envelopes of a frame of an audio signal, wherein N is an even integer;

organizing the N frequency envelopes into N1 groups, wherein each group comprises two frequency envelopes, and N=2×N1;

quantizing a first group of frequency envelopes to obtain a first vector by using a codebook, wherein the codebook has $2^B$ code words and each code word corresponds to a vector, and B is a positive integer greater than or equal to 2;

determining if a code word corresponding to the first vector is in a first half of the codebook or in a second half of the codebook; and if the code word corresponding to the first vector is in the first half of the codebook, quantizing a second group of frequency envelopes by using the first half of the codebook, or if the code word corresponding to the first vector is in the second half of the codebook, quantizing a second group of frequency envelopes by using the second half of the codebook.

6. The apparatus according to claim 5, wherein N is 8.
7. The apparatus according to claim 6, wherein B is 4.
8. The apparatus according to claim 5, wherein B is 4.
9. A method of quantizing frequency envelops of an audio signal for use by an audio signal encoder, comprising:

obtaining N frequency envelopes of a frame of the audio signal, wherein N is an even integer;

organizing the N frequency envelopes into N1 groups, wherein each group comprises two frequency envelopes, and N=2×N1;

quantizing a first group of frequency envelopes to obtain a first vector by using a codebook, wherein the codebook has $2^B$ code words and each code word corresponds to a vector, and B is a positive integer greater than or equal to 2;

determining if the first vector is in a first half of the codebook or in a second half of the codebook; and if the first vector is in the first half of the codebook, quantizing a second group of frequency envelopes by using the first half of the codebook, or if the first vector is in the second half of the codebook, quantizing a second group of frequency envelopes by using the second half of the codebook.

10. The method according to claim 9, wherein N is 8.
11. The method according to claim 10, wherein B is 4.
12. The method according to claim 9, wherein B is 4.
13. An audio signal encoding apparatus, comprising a processor and a memory storing program codes, wherein the program codes, when executed by the processor, cause the apparatus to perform a process that comprises:

obtaining N frequency envelopes of a frame of an audio signal, wherein N is an even integer;

organizing the N frequency envelopes into N1 groups, wherein each group comprises two frequency envelopes, and N=2×N1;

quantizing a first group of frequency envelopes to obtain a first vector by using a codebook, wherein the codebook has $2^B$ code words and each code word corresponds to a vector, and B is a positive integer greater than or equal to 2;

determining if the first vector is in a first half of the codebook or in a second half of the codebook; and if the first vector is in the first half of the codebook, quantizing a second group of frequency envelopes by using the first half of the codebook, or if the first vector is in the second half of the codebook, quantizing a second group of frequency envelopes by using the second half of the codebook.

14. The apparatus according to claim 13, wherein N is 8.
15. The apparatus according to claim 14, wherein B is 4.
16. The apparatus according to claim 13, wherein B is 4.

* * * * *